United States Patent
Marmonier

(10) Patent No.: US 10,027,103 B2
(45) Date of Patent: Jul. 17, 2018

(54) PROTECTION DEVICE FOR ELECTRICAL NETWORK

(71) Applicant: Schneider Electric Industries SAS, Rueil-Malmaison (FR)

(72) Inventor: Jean Marmonier, Saint Aunes (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 54 days.

(21) Appl. No.: 15/131,466

(22) Filed: Apr. 18, 2016

(65) Prior Publication Data
US 2016/0322804 A1    Nov. 3, 2016

(30) Foreign Application Priority Data

Apr. 30, 2015   (FR) ...................................... 15 53905

(51) Int. Cl.
*H02H 3/08*     (2006.01)
*H02H 3/04*     (2006.01)
(Continued)

(52) U.S. Cl.
CPC ............. *H02H 3/044* (2013.01); *G01R 15/18* (2013.01); *G01R 19/2513* (2013.01);
(Continued)

(58) Field of Classification Search
CPC ........ H02H 1/0015; H02H 5/083; H02H 3/08; H02H 7/222; H02H 11/00; H02H 3/006;
(Continued)

(56) References Cited

U.S. PATENT DOCUMENTS

| 4,361,800 A | * | 11/1982 | Fodali | .................. | G01R 19/155 |
| | | | | | 324/556 |
| 4,837,488 A | * | 6/1989 | Donahue | .............. | G01R 31/023 |
| | | | | | 324/539 |

(Continued)

FOREIGN PATENT DOCUMENTS

| EP | 2 887 482 A1 | 6/2015 |
| FR | 2 936 908 | 4/2010 |

(Continued)

OTHER PUBLICATIONS

French Preliminary Search Report (with Written Opinion) dated Mar. 23, 2016 in French Application 15 53905 filed on Apr. 30, 2015 (with English Translation of Categories of Cited Documents).

*Primary Examiner* — Jermele M Hollington
*Assistant Examiner* — Taqi Nasir
(74) *Attorney, Agent, or Firm* — Oblon, McClelland, Maier & Neustadt, L.L.P.

(57) ABSTRACT

A device for protecting a medium or high voltage electrical network is provided, including a base part connected to means for measuring values representative of the electrical network and to a trip circuit of the electrical network, an active part that includes means for analogue-digital conversion of the values representative of the electrical network and which is mechanically and electrically connected to the base part in a first position referred to as the normal position, and a removable test part that is mechanically and electrically connected to the active part in a second position referred to as the test position. The test part includes means for mechanically and electrically connecting to the base part such that, in the test position, external terminals of the test part are connected to the trip circuit through the base part.

11 Claims, 6 Drawing Sheets

(51) Int. Cl.
*G01R 31/327* (2006.01)
*H02H 3/347* (2006.01)
*G01R 15/18* (2006.01)
*G01R 19/25* (2006.01)
*H02H 3/10* (2006.01)
*H01R 9/26* (2006.01)
*H01R 31/06* (2006.01)

(52) U.S. Cl.
CPC ....... *G01R 31/327* (2013.01); *G01R 31/3275* (2013.01); *H02H 3/08* (2013.01); *H02H 3/10* (2013.01); *H02H 3/347* (2013.01); *H01R 9/2675* (2013.01); *H01R 31/065* (2013.01); *H01R 2201/20* (2013.01)

(58) Field of Classification Search
CPC .......... H02H 3/10; H02H 7/20; G01R 31/025; G01R 31/2889; G01R 31/045; G01R 31/026; G01R 31/043; G01R 31/2601; G01R 31/3278; G01R 1/04; G01R 31/006; G01R 31/2886; G01R 31/2896; G01R 31/041
USPC .............. 324/541, 750.05, 418, 750.24, 538, 324/762.02, 762.06, 756.01, 754.02, 324/750.18; 361/2, 1, 78, 116, 195, 602, 361/605
See application file for complete search history.

(56) References Cited

U.S. PATENT DOCUMENTS

| | | | | |
|---|---|---|---|---|
| 4,843,327 | A * | 6/1989 | Koppitsch | G01M 3/165 174/11 R |
| 4,855,672 | A * | 8/1989 | Shreeve | G01R 31/2642 324/750.05 |
| 5,367,263 | A * | 11/1994 | Ueda | G01R 31/2884 324/537 |
| 5,430,604 | A * | 7/1995 | Wong | G01R 31/001 324/122 |
| 2011/0299199 | A1* | 12/2011 | Marmonier | H01R 9/2666 361/1 |
| 2015/0200524 | A1* | 7/2015 | Seel | H04B 1/1607 361/634 |
| 2015/0200534 | A1* | 7/2015 | Nakamura | G01R 31/3278 361/18 |

FOREIGN PATENT DOCUMENTS

| | | |
|---|---|---|
| FR | 3 000 319 A1 | 6/2014 |
| FR | 3 021 463 A1 | 11/2015 |

* cited by examiner

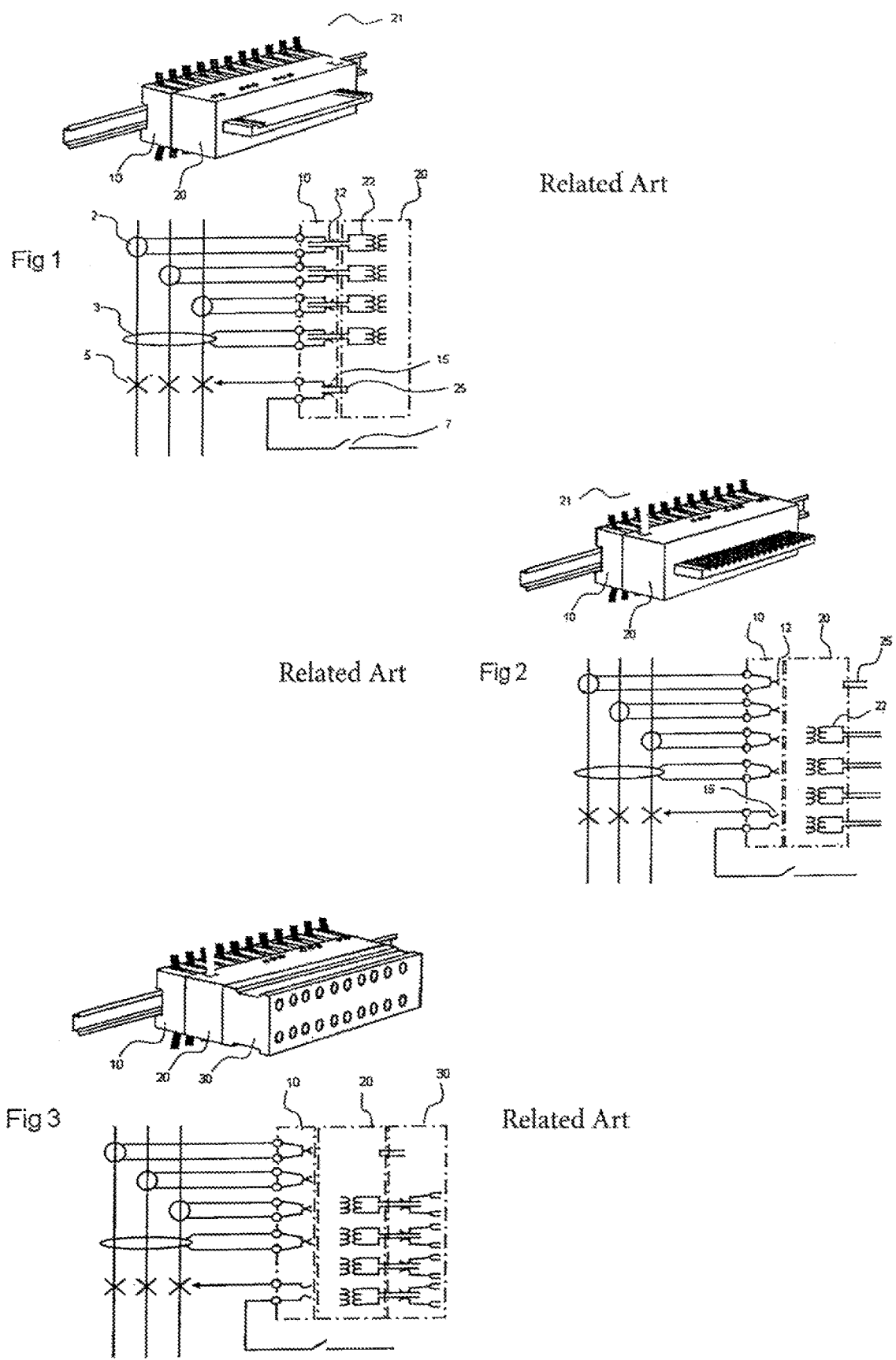

PROTECTION DEVICE FOR ELECTRICAL NETWORK

TECHNICAL FIELD OF THE INVENTION

The field of the invention is that of devices or relays for protecting electrical circuits and, more specifically, devices for protecting medium and high voltage electrical networks, such as overhead lines, overhead, underground or overhead-underground cables or connections, transformer starters, motor starters, etc.

PRIOR ART

A particularity of these protection devices is to continuously take electrical data measurements, such as the values of currents and voltages that are provided by current and voltage transformers installed on conductors of the electrical network.

The electrical data are gathered in analogue format across a plurality of transformers arranged on the electrical network, transmitted to the protection device via low voltage cables, then converted to digital format inside these protection devices.

Next, the protection devices use computer programs to compare, at a given point in time, the measured electrical data with reference electrical data specific to a determined operation.

In the event a malfunction or an anomaly is detected by a protection device, the latter may command switches or circuit breakers to open or close so as to safeguard the electrical network.

Known from the document FR2936908 is a device for protecting a medium or high voltage electrical network. Such a protection device is shown in FIGS. 1 to 3. It comprises a base part 10 that is connected to current and/or voltage transformers 2, 3, via analogue links, in order to measure currents/voltages of the electrical network, and which is connected to a trip circuit of the electrical network allowing a trip command to be transmitted to a circuit breaker or a switch 5, in particular in the event of a fault in the electrical network. The protection device also comprises an active part 20 that carries out an analogue-digital conversion of the current/voltage measurements issuing from the base part and which is connected via a digital link 21 to a central processing unit of the protection relay, the former being charged with monitoring the measured currents/voltages and if necessary, sending a trip command back to the active part. If made possible by miniaturization, the active part may be integrated in the central processing unit of the protection relay.

With the aim of being able to carry out functional tests of the protection relay, the device also comprises a test part 30 that is capable of being connected to the active part in place of the base part, so as to simulate the current/voltage measurements carried out on the electrical network. Thus, by connecting external means for injecting current/voltage into this test part, it is then possible to test the operation of the protection relay in order to simulate current and voltage transformers. It must of course be possible to carry out these connection/disconnection operations while avoiding any premature trip command of the switches/circuit breakers of the electrical network or any endangerment of the operators, in particular when disconnecting current transformers.

In order to carry out the functional tests, the device is placed in the test position in which the active part 20 is electrically disconnected from the base part 10 and hence from the voltage and current transformers and from the trip circuit. As may be seen in FIGS. 2 and 3, the part is subsequently turned around so as to be able to accommodate the test part 30 on one side and to be mechanically fixed to the base part 10 on the other side. In this way, the active part 20 continues to receive an electrical power supply issuing from the base part 10 and may accommodate a test part 30 in order to simulate the current and voltage transformers.

However, turning the active part around in order to place it in the test position constitutes a procedure that is unlikely to be intuitive to an operator. Moreover, the test position no longer allows the operator to access the trip circuit, as the active part 20 masks the access to the base part 10. However, during functional tests it is very useful to be able to continue to detect the occurrence of a trip command and to check the continuity of the trip circuit.

An aim of the invention is therefore to overcome the drawbacks mentioned above and to facilitate the use of a protection device during functional test phases. Indeed, by virtue of the invention, the procedures for switching from the normal position to the test position are easier to carry out and highly intuitive to an operator. Moreover, the invention allows quick access to the trip circuit to be maintained during the test phase of the protection device. An operator will thus be able to connect to this trip circuit by virtue of accessible external terminals.

SUMMARY OF THE INVENTION

This aim 1s achieved by a device for protecting a medium or high voltage electrical network, comprising a base part connected to means for measuring values representative of the electrical network and connected to a trip circuit of the electrical network, a removable active part that comprises means for analogue-digital conversion of the values representative of the electrical network and which is mechanically and electrically connected to the base part in a first position referred to as the normal position, and a removable test part that comprises mechanical and electrical connection means to the active part so that, in a second position referred to as the test position, the active part is connected to the test part and second external terminals of the test part are connected to the active part in order to simulate current or voltage measures.

According to the invention, the test part comprises means for mechanically and electrically connecting to the base part such that, in the test position, the test part is connected to the base part in place of the active part and first external terminals of the test part are connected to the trip circuit through the base part.

According to a first feature, the measuring means comprise current transformers allowing electric currents of the network to be measured. According to another feature, the measuring means comprise voltage transformers allowing electric voltages of the network to be measured.

The analogue-digital conversion means of the active part are connected to the measuring means through the base part in the normal position and to the second external terminals of the test part in the test position.

The base part comprises a housing for accommodating the active part in the normal position and for accommodating the test part in the test position. The test part comprises a cavity for accommodating the active part in the test position.

According to one preferred embodiment, the first and the second external terminals of the test part are located next to the cavity.

In a variant of the invention, the protection device comprises a first base part connected to current transformers for measuring electric currents of the network and a second, separate base part connected to voltage transformers for measuring electric voltages of the network. The protection device comprises a first active part and a first test part interacting with the first base part, as well as a second active part and a second test part interacting with the second base part.

BRIEF DESCRIPTION OF THE FIGURES

Other features will appear in the following detailed description given in conjunction with the appended drawings in which:

FIGS. 1, 2 and 3 show, in a simplified manner and with the associated circuit diagram, a known protection device, FIG. 1 showing the device in the normal position, FIG. 2 in the reversed position and FIG. 3 in the test position;

With reference to FIGS. 4a and 4b, a device for protecting a medium or high voltage three-phase electrical network 1 comprises a base part 40 that is, for example, mounted on a DIN rail. The base part 40 is connected via an interface terminal block 41 to means for measuring values representative of the electrical network 1, such as the current and voltage values. In the example of FIG. 4, these measuring means comprise current transformers 2, 3 that allow currents flowing in conductors of the electrical network 1 to be measured. The measuring means are connected to the interface terminal block 41 via analogue links. The measuring means could, of course, also comprise voltage transformers in order to measure voltages of the electrical network 1.

The base part is also connected to a trip circuit 8 of the electrical network via the interface terminal block 41. In a known manner, such a trip circuit 8 allows a circuit breaker 5 to be controlled in the event a malfunction is detected in the electrical network. In the trip circuit 8, the command to trip the circuit breaker 5 is symbolically represented by a trip contact 7 which, when it is closed, allows power to be supplied to a trip coil of the circuit breaker 5 so as to open the circuit of the circuit breaker.

Figure 4A:
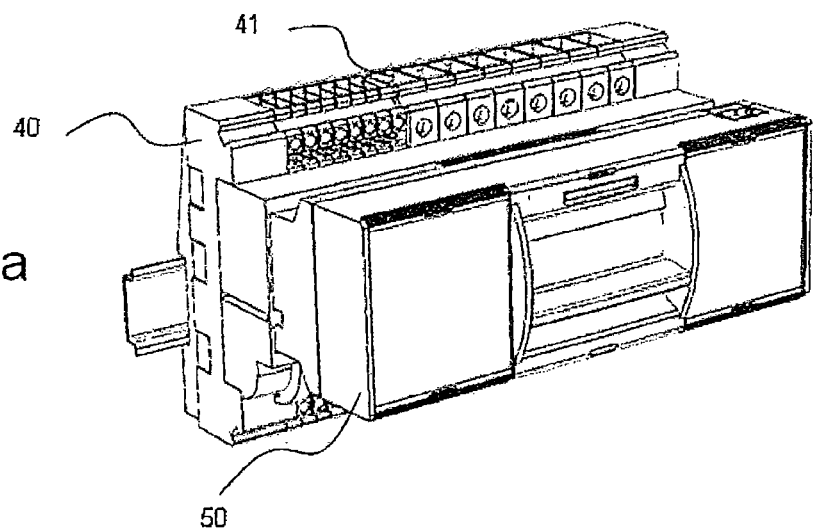
FIG. 4a shows an exemplary protection device according to the invention in the normal position and FIG. 4b gives the associated circuit diagram.
Figure 4B:
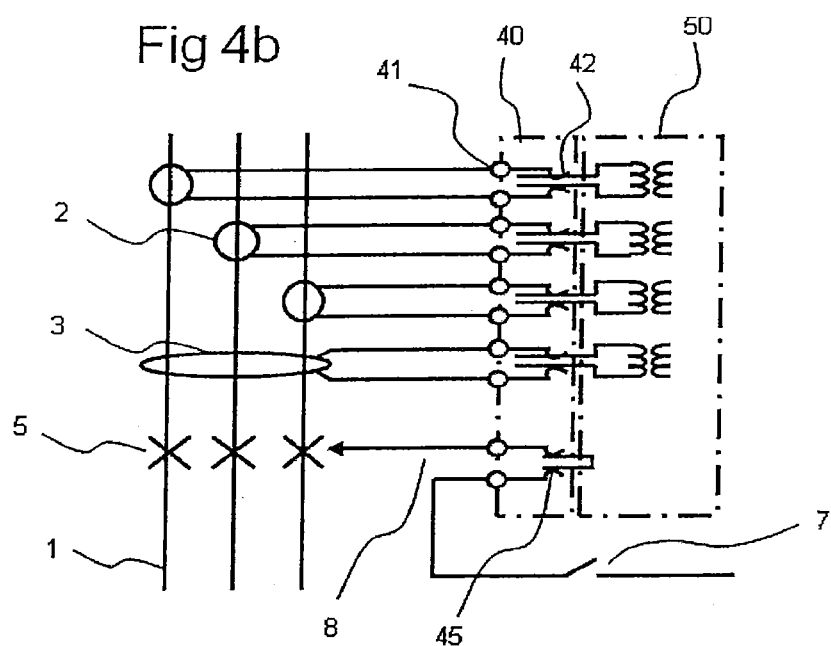

The protection device next comprises an active part 50 that in particular comprises analogue-digital conversion means. In a first position referred to as the normal position shown in FIG. 4a, the active part 50 is mechanically and electrically connected to the base part 40. Specifically, the active part 50 is inserted into a housing 44 of the base part 40 such that pins 42, 45 of the base part 40 are connected to complementary pins 52, 55 of the active part 50. The active part 50 may therefore receive analogue signals originating from the current transformers 2, 3 through the base part 40. The pins 42, 52 allow the measuring means to be connected to the active part 50 and the pins 45, 55 are used to close the trip circuit 8 via the active part 50.

This normal position corresponds to the usual operation of the protection device. In this position, the digital signals generated by the active part 50 based on the analogue measurement signals may thus be transmitted to a processing unit (not shown in the figures) of the protection device that analyses them in order to take the potential decisions required in the event of a malfunction, for example to close the trip contact 7 so as to open the circuit breaker 5.

Figure 5A:
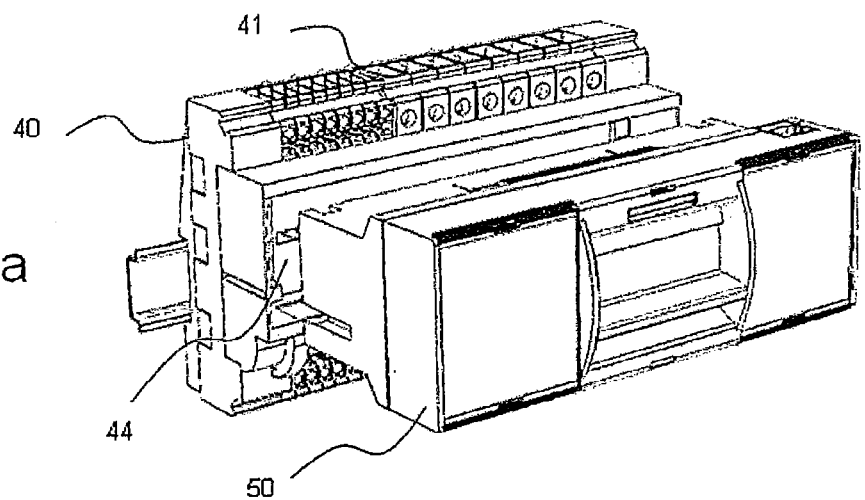
FIG. 5a shows the device of FIG. 4a as the active part is being removed and FIG. 5b gives the associated circuit diagram.
Figure 5B:
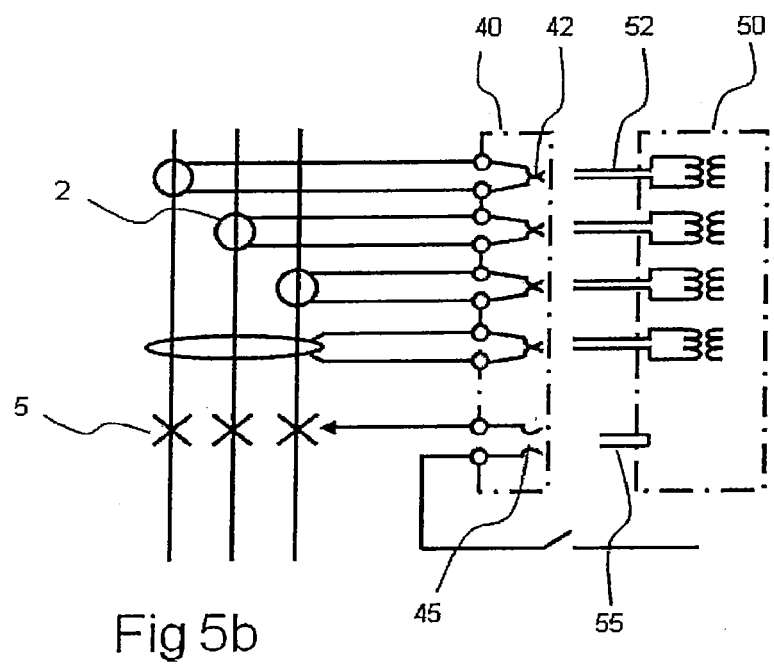

FIGS. 5a and 5b show the active part 50 when it is disconnected from the base part 40, i.e. when the active part 50 is no longer inserted in the housing 44. In the case that a current transformer 2, 3 is used to measure the current in the electrical network, it is important to ensure that the electrical circuit of the current transformers is not interrupted while the active part 50 is being disconnected, which would create significant safety issues. For this reason the pins 42 are spring-loaded and automatically mutually close back up so as to avoid any premature opening of the circuit of the current transformers during the removal of the active part 50.

It should be noted that, at the level of the active part 50, the pins 55 of the trip circuit are shorter than the pins 52 of the measuring means, such that, as the active part 50 is being removed, the trip circuit 8 is first opened before the measuring means are disconnected. Otherwise, the processing unit of the protection device could detect a malfunction in the measurements which would lead to the premature occurrence of a fault, causing the trip contact 7 to close and hence the circuit breaker 5 to open.

Figure 6A:
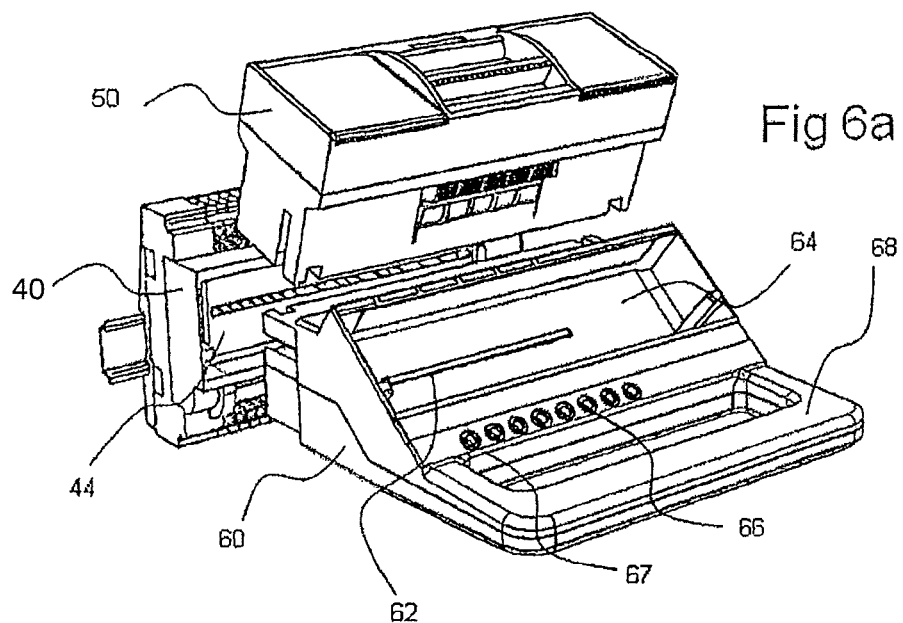
FIG. 6a shows the device according to the invention with the base, active and test parts disconnected and FIG. 6b gives the associated circuit diagram.
Figure 7A:
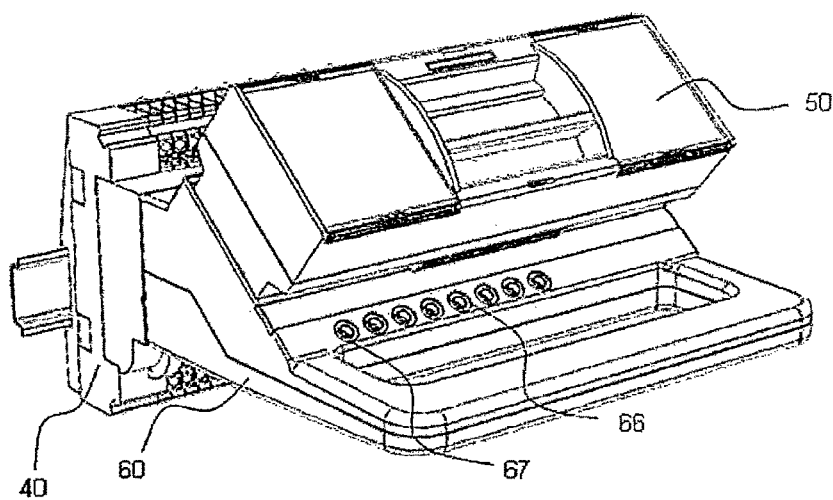
FIG. 7a shows the device according to the invention in the test position and FIG. 7b gives the associated circuit diagram.

In FIGS. 6a and 7a, the protection device comprises the base part 40, the active part 50 and a removable test part 60. The test part 60 is intended to be able to carry out functional tests of the protection device. It comprises external terminals 66, 67, respectively called first external terminals 67 and second external terminals 66, which are available to an operator, along with a handle 68 for easy handling thereof and a cavity 64 housing a connector 62 for accommodating the active part 50. By virtue of the handle 68, the use becomes very intuitive to an operator, who, once holding the test handle, immediately understands how to place the protection device in the test position.

When the protection device is in a second position called the test position, the aim 1s to disconnect the means for measuring the values representative of the electrical network 1 and to replace them with external simulation means (not shown in the figures) that are connected to the second external terminals 66 of the test part 60, so as to be able to carry out functional tests of the protection device simulating current or voltage measures.

In the test position, FIG. 7a shows that the test part 60 is mechanically fixed to the base part 40 by being inserted into the housing 44. Guiding means, such as grooves, may facilitate this insertion. The test part 60 is also mechanically and electrically connected to the active part 50. Specifically, the active part 50 is inserted into the cavity 64 of the test part 60, such that the pins 52 of the active part 50 electrically connect to the connector 62. Guiding means, such as grooves, may also facilitate this insertion.

Figure 6B:
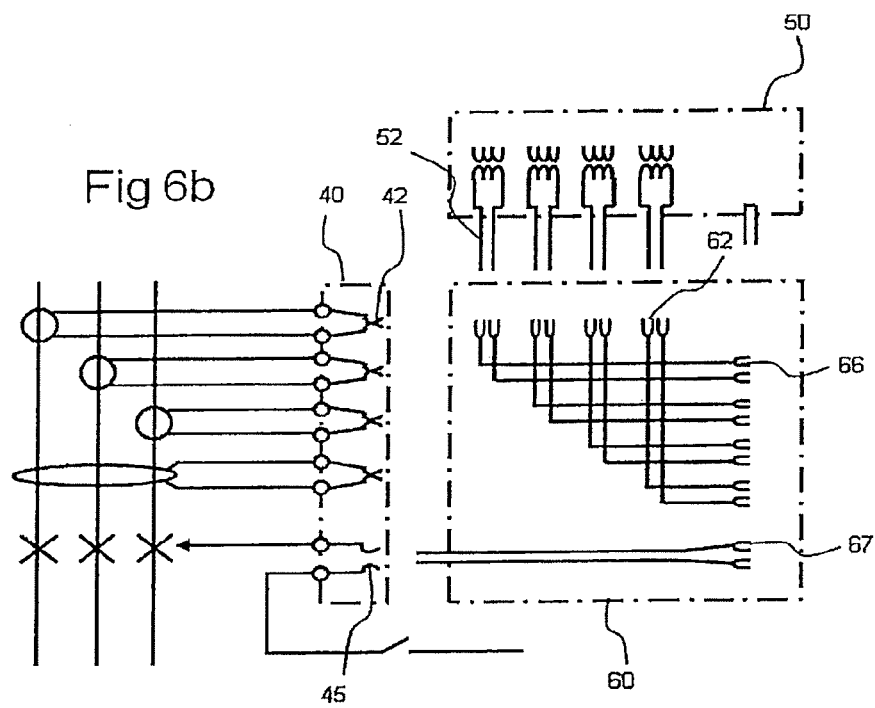
Figure 7B:
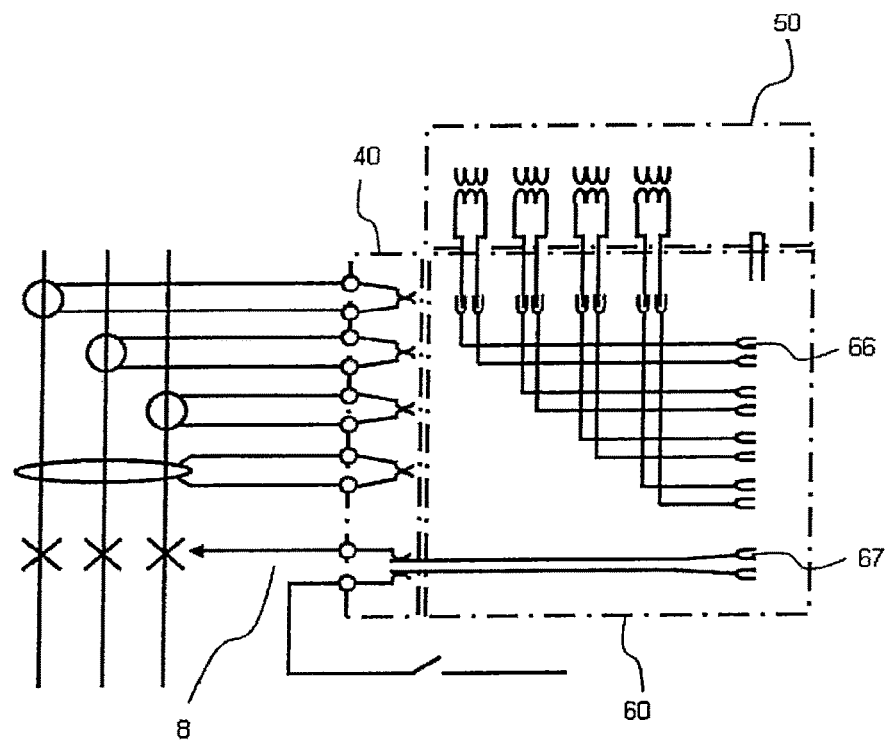

As indicated in FIGS. 6b and 7b, the pins 42 of the base part 40 are not connected in the test position. Only the pins 45 of the base part 40, corresponding to the trip circuit 8, are electrically connected to the test part 60 such that the trip circuit 8 is connected to the first external terminals 67 of the test part 60. In order to facilitate easy access, one simple embodiment is to position the first external terminals 67, as well as the second external terminals 66, next to the cavity 64, thereby making them accessible to an operator in test position when the active part 50 is housed in the cavity 64. Thus, by using these first external terminals 67, an operator advantageously always has access to the trip circuit 8 during the functional tests.

As mentioned above, the means for measuring the current and voltage values of the electrical network 1 may comprise current transformers and/or voltage transformers. In the example of FIGS. 4 to 7, only current transformers are shown in order to simplify the figures. Nonetheless, it would be possible to envisage, in an equivalent manner, one and the same base part 40 being able to be connected, via a single interface terminal block 41, to current transformers and voltage transformers.

Figure 8A:
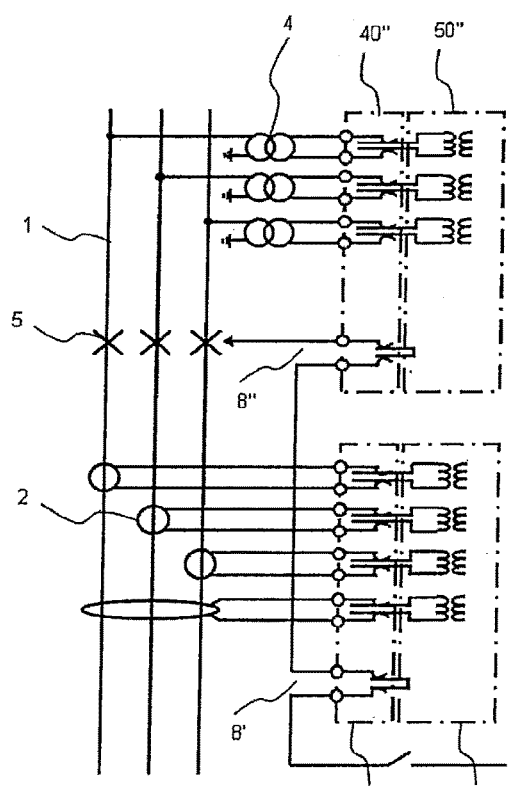
FIGS. 8a and 8b show a variant of the device according to the invention.
Figure 8B:
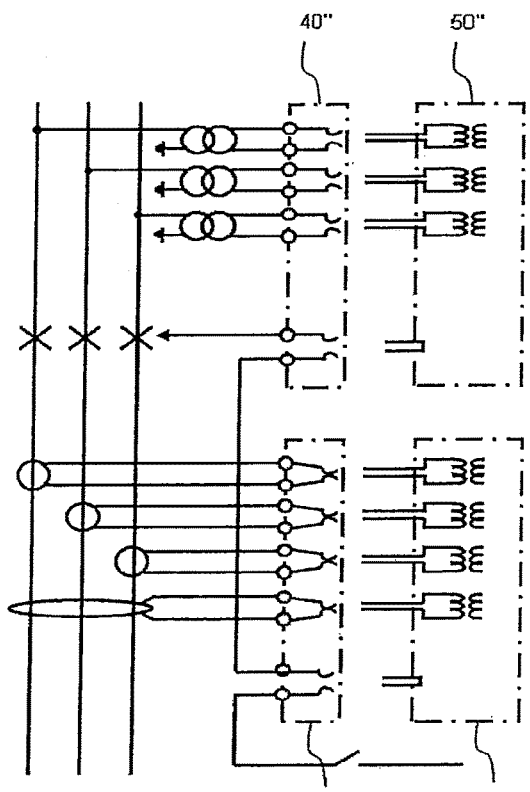

According to another alternative embodiment shown diagrammatically in FIGS. 8a and 8b, the protection device comprises a first base part 40' connected to current transformers 2 via an interface terminal block 41' in order to measure currents in the electrical network and a second, separate base part 40" connected to voltage transformers 4 via an interface terminal 41" in order to measure voltages in the electrical network. This division into two separate base parts 40', 40" allows greater modularity and greater flexibility of use, as it makes it possible to have some protection devices measuring only the current, others only the voltage and others measuring both.

The protection device according to FIGS. 8a and 8b therefore comprises a first active part 50' interacting with the first base part 40' and a second, separate active part 50" interacting with the second base part 40". In a similar manner, such a protection device comprises a first test part interacting with the first base part 40' and a second test part interacting with the second base part 40", not shown in the figures. The trip circuit of such a protection device is formed by the connection in series of a first circuit 8', corresponding to the first base part 40', with a second circuit 8", corresponding to the second base part 40".

FIG. 8a shows the protection device in the normal position with the base and active parts mutually connected, while FIG. 8b shows the base and active parts disconnected.

The invention claimed is:

1. A device for protecting a medium or high voltage electrical network, comprising:
    a base part connected to means for measuring values representative of the electrical network and connected to a trip circuit of the electrical network;
    a removable active part that comprises means for analogue-digital conversion of the values representative of the electrical network and which is mechanically and electrically connected to the base part in a first position referred to as a normal position; and
    a removable test part that comprises mechanical and electrical connection means to the active part so that, in a second position referred to as a test position, the active part is connected to the test part and second external terminals of the test part are connected to the active part in order to simulate current or voltage measures,
    wherein the test part comprises means for mechanically and electrically connecting to the base part such that, in the test position, the test part is connected to the base part at a same location in which the active part is connected to the base part in the normal position, and first external terminals of the test part are connected to the trip circuit through the base part, while the active part is connected to the test part.

2. The device according to claim 1, wherein the measuring means comprise current transformers allowing electric currents of the network to be measured.

3. The device according to claim 1, wherein the measuring means comprise voltage transformers allowing electric voltages of the network to be measured.

4. The device according to claim 1, wherein the analogue-digital conversion means of the active part are connected to the measuring means through the base part in the normal position and to the second external terminals of the test part in the test position.

5. The device according to claim 1, wherein the base part comprises a housing for accommodating the active part in the normal position and for accommodating the test part in the test position.

6. The device according to claim 1, wherein the test part comprises a cavity for accommodating the active part in the test position.

7. The device according to claim 6, wherein the first and the second external terminals of the test part are located next to the cavity.

8. The device according to claim 1, further comprising a first base part connected to current transformers for measuring electric currents of the network and a second, separate base part connected to voltage transformers for measuring electric voltages of the network.

9. The device according to claim 8, further comprising a first active part and a first test part interacting with the first base part, as well as a second active part and a second test part interacting with the second base part.

10. The device according to claim 1, wherein, in the test position, the test part is directly connected to the base part and the active part is directly connected to the test part.

11. A device comprising:
    a base part connected to a transformer to measure values representative of an electrical network and connected to a trip circuit of the electrical network;
    a removable active part that comprises an analogue-digital converter to convert the values representative of the electrical network and which is mechanically and electrically connected to the base part in a first position referred to as a normal position; and
    a removable test part that comprises a mechanical and electrical connector to the active part so that, in a second position referred to as a test position, the active part is connected to the test part and second external terminals of the test part are connected to the active part in order to simulate current or voltage measures,
    wherein the test part comprises a connector to mechanically and electrically connect to the base part such that, in the test position, the test part is connected to the base part at a same location in which the active part is connected to the base part in the normal position, and first external terminals of the test part are connected to the trip circuit through the base part, while the active part is connected to the test part.

\* \* \* \* \*